(12) United States Patent
Platise

(10) Patent No.: US 9,927,464 B2
(45) Date of Patent: Mar. 27, 2018

(54) DEVICE FOR THE ISOLATED MEASUREMENT OF CURRENT AND A METHOD FOR THE ISOLATED DETERMINATION OF CURRENT

(71) Applicant: SIEVA D.O.O.—POSLOVNA ENOTA IDRIJA, Idrija (SI)

(72) Inventor: Uros Platise, Kranj (SI)

(73) Assignee: SIEVA D.O.O.—POSLOVNA ENOTA IDRIJA, Idrija (SI)

( * ) Notice: Subject to any disclaimer, the term of this patent is extended or adjusted under 35 U.S.C. 154(b) by 59 days.

(21) Appl. No.: 14/702,108

(22) Filed: May 1, 2015

(65) Prior Publication Data

US 2015/0233977 A1 Aug. 20, 2015

Related U.S. Application Data

(63) Continuation of application No. PCT/EP2013/003278, filed on Oct. 31, 2013.

(30) Foreign Application Priority Data

Nov. 2, 2012 (DE) .................. 10 2012 021 364

(51) Int. Cl.
*G01R 15/20* (2006.01)
*G01R 19/00* (2006.01)

(52) U.S. Cl.
CPC .......... *G01R 15/20* (2013.01); *G01R 19/0092* (2013.01)

(58) Field of Classification Search
CPC ..... G01R 15/18; G01R 15/183; G01R 15/186
USPC .............. 324/117 R, 126, 127; 336/173, 174
See application file for complete search history.

(56) References Cited

U.S. PATENT DOCUMENTS

| 4,280,162 A * | 7/1981 | Tanka | H02H 3/332 324/117 R |
| 4,639,665 A | 1/1987 | Gary | |
| 7,218,092 B2 * | 5/2007 | Tadatsu | G01R 15/183 324/110 |

(Continued)

FOREIGN PATENT DOCUMENTS

| DE | 10011047 A1 | 9/2001 |
| DE | 10110475 A1 | 9/2002 |

(Continued)

OTHER PUBLICATIONS

International Search Report for corresponding International Application No. PCT/EP2013/003278, dated Feb. 5, 2014.

*Primary Examiner* — Walter L Lindsay, Jr.
*Assistant Examiner* — Milton Gonzalez
(74) *Attorney, Agent, or Firm* — Myers Wolin, LLC

(57) ABSTRACT

A device is provided for the isolated measurement of current, comprising a magnetic core that has an opening through which a primary conductor extends, and at least one measurement region that has at least two openings which divide each measurement region into at least three adjacent flux paths. The device additionally comprises a compensator winding that is wound about parts of the core outside of the at least one measurement region, at least two flux paths of the same measurement region, around which at least one exciter winding is wound, as well as at least one measurement winding that is wound about parts of the measurement region. A method is also provided for determining current in an isolated manner using the provided device.

21 Claims, 6 Drawing Sheets

(56) References Cited

Figure 1:
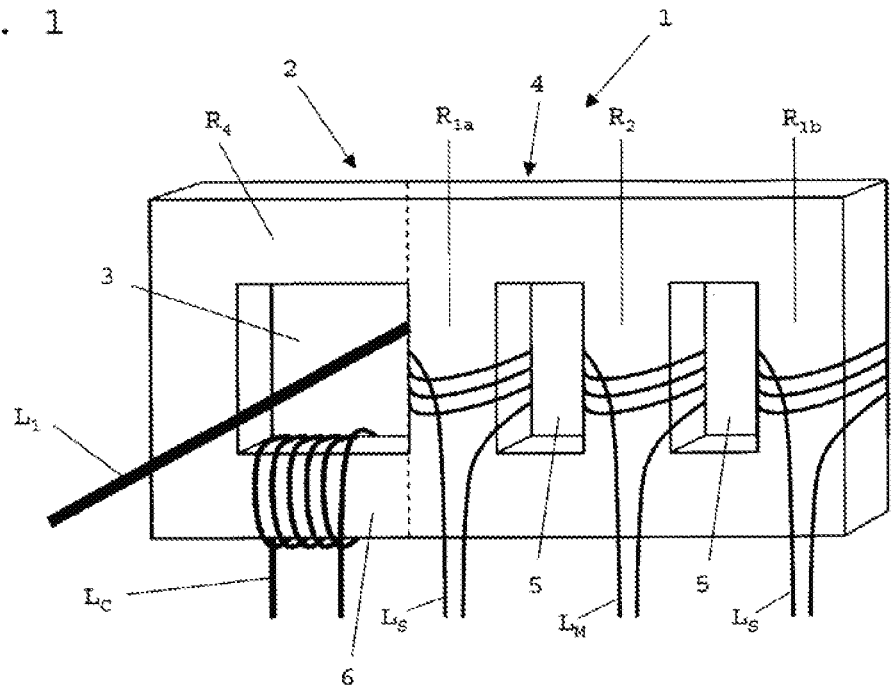

U.S. PATENT DOCUMENTS 7,400,131 B2 * 7/2008 Preusse ................ G01R 15/148
                                                            324/117 R
7,579,825 B2 * 8/2009 Hausperger .......... G01R 15/207
                                                            324/117 H

FOREIGN PATENT DOCUMENTS

| EP | 0132745 A2 | 2/1985 |
| EP | 1542025 A1 | 6/2005 |
| GB | 1481263 A | 7/1977 |
| GB | 1488262 A | 10/1977 |
| GB | 2237114 A | 4/1991 |

* cited by examiner

DEVICE FOR THE ISOLATED MEASUREMENT OF CURRENT AND A METHOD FOR THE ISOLATED DETERMINATION OF CURRENT

The invention relates to a device, for isolated measurement of current, which comprises a magnetic core with at least one measuring region and an opening through which a primary conductor is routed, a compensating winding, which is wound around parts of the core outside the measuring region, at least one exciter winding and at least one measuring winding. The invention also relates to a method for isolated determination of current using such an aforesaid device for isolated measurement of current.

The said devices are usually used for isolated measurement of very high direct currents, albeit also of alternating currents, wherein a current-carrying primary conductor, the current of which is to be measured, induces in a magnetic core a magnetic flux, which is proportional to the current to be measured. The magnetic core is provided with auxiliary means, with which its magnetic field can be influenced or sensed, whereby an indirect measurement of the current is possible. This principle offers the advantage that the current-carrying primary conductor does not have to be in galvanic connection with the magnetic core or its auxiliary means. Such devices and methods of isolated current measurement are disclosed in different ways by the prior art.

The use of Hall sensors to sense magnetic fields of magnetic cores is very common. In this principle, a current-carrying primary conductor is routed through a magnetic core, which is wound by a compensating winding and which has a gap in which a Hall sensor is disposed. In the magnetic core, the current-carrying primary conductor induces a magnetic primary flux, while the compensating winding induces a compensating flux, which depends on the magnetic flux measured by the Hall sensor and counteracts the primary flux. The air gap inherent to this measuring arrangement hinders passage of the magnetic flux without interfering flux, limits the measuring accuracy and depends on the size of the Hall sensor disposed in the air gap. In this regard pertinent prior art can be found, for example, in DE 10011047 A1, U.S. Pat. No. 4,639,665 A or GB 2237114 A.

GB 1488262 A teaches a device and a method for contactless measurement of direct current in a current-carrying primary conductor. The device comprises a closed magnetic core with an exciter winding, a measuring winding, a compensating winding and a current-carrying primary conductor. The exciter winding is connected to a signal source for generation of an alternating signal, while the measuring winding is connected to the input and the compensating winding to the output of a switched circuit. The current-carrying primary conductor induces a magnetic flux in the magnetic core, the exciter winding saturates the magnetic core by the alternating current in each half cycle, thereby producing a pulsed signal in the measuring winding. By means of the pulse-width ratio of the pulsed signal of the exciter voltage, the switched circuit controls a compensating current, which can be injected into the compensating winding and measured and which induces a magnetic flux in the magnetic core and cancels out the magnetic flux generated by the current-carrying primary conductor. In the device disclosed by GB 1488262 A, a relatively large portion of the magnetic core is saturated by the exciter winding, which makes the magnetic core susceptible to remanence and consumes relatively much energy. Furthermore, the device reacts relatively slowly, within 0.02 s, to current changes in the current-carrying primary conductor and is not designed to measure both high direct currents and alternating currents within a broad bandwidth.

GB 1481263 A discloses a measuring instrument, for isolated measurement of the current in a current-carrying primary conductor, which induces a magnetic flux in a magnetic core. The measuring instrument comprises an open magnetic core with a plurality of paths of different widths to provide several routes for the magnetic flux induced by the current-carrying primary conductor. To avoid magnetic saturation of the magnetic core, one of these paths has a gap that can be enlarged temporarily, in order to introduce the current-carrying primary conductor into the magnetic core. A pair of exciter windings is wound around a narrow path of the magnetic core and designed to induce alternating magnetic flux in opposite directions in the path and to saturate this magnetically. The measuring instrument further has means for comparing the positive and negative induction peaks, so that the intensity of the current flowing through the current-carrying primary conductor can be determined. For current measurement with the measuring instrument according to GB 1481263 A, two exciter windings with corresponding switching elements are always needed. It is a disadvantage that a relatively large region of the magnetic core is saturated by the exciter windings, whereby the measuring instrument consumes relatively much energy. Furthermore, no compensating winding is provided, whereby the measurement of very high currents is not possible or is possible only with correspondingly larger dimensioning of the measuring instrument. Furthermore, the magnetic saturation of the core makes it susceptible to remanence effects, which are due to the absence of a compensating winding but which the air gap is intended to counter. On the other hand, the air gap has a detrimental effect on measuring accuracy and the measuring region that can be sensed.

EP 1542025 A1 discloses several devices and methods for indirect sensing of current with so-called magnetic bridges, which subdivide a magnetic core into three paths. The magnetic bridges are designed to detect a magnetic field of a current-carrying primary conductor, the current of which is to be measured. By means of an optional compensating winding, the magnetic flux of the current-carrying primary conductor can be canceled out. Devices are shown with magnetic bridges, in which two external paths of respectively one sinusoidally energized winding are wound. The energization of the windings can be achieved with equal and opposite amplitudes, whereby the two windings are expected to induce a self-cancelling magnetic flux in the middle path disposed between them. This so-called "magnetic balance" is perturbed at first as soon as a current flows through the primary conductor, but is then restored by energization of the exciter windings. By means of different devices and methods, this adaptation of energization is used to determine the current flowing through the current-carrying primary conductor indirectly. A disadvantage of the devices disclosed by EP 1542025 A1 is that the current-carrying primary conductor—to the extent provided—is routed through the measuring region, whereby undesired interactions can arise between the magnetic flux induced by the current-carrying primary conductor in the magnetic bridge and that of the exciter windings. In addition, the restoration of the magnetic balance is cumbersome and complex. Moreover, a magnetic alternating flux is always induced in a very large region and in most cases even in the entire region of the magnetic core by the exciter winding, whereby the occurrence of undesired remanence effects is favored and the energy consumption is increased.

EP 0132745 A2 discloses a device, operating according to the zero-flux principle, for measuring direct currents. The device comprises a magnetic core with an isthmus, a primary conductor, a compensating winding, an indicator winding and a premagnetization winding, wherein the isthmus represents a narrow section of the core produced, for example, by at least one bore through the core cross section. The indicator winding delivers an input variable for a differential amplifier and, together with the latter, causes a current to flow in the compensating winding and to result in a flux close to zero in the core. The premagnetization winding is subjected to an alternating current. In the region of the isthmus, the core consists of a parallel connection of at least two magnetic conductors, one of which supports the premagnetization winding as well as the indicator winding. This is intended to ensure that only a small volume of the core, namely the conductor supporting the premagnetization winding and the indicator winding, has to be reverse-magnetized. One disadvantage, however, is in particular the fact that the premagnetization winding induces magnetic interfering fluxes and noise in all conductors of the isthmus and in parts of the core, thus preventing generation of the zero-flux condition in the core and adversely affecting the measuring accuracy of the device. In one exemplary embodiment, the core comprises two isthmuses separated from one another and consisting respectively of a parallel connection of three magnetic conductors, wherein both the indicator winding and the premagnetization winding are exclusively mounted on the respective middle conductor of the isthmuses. The intention is that in this way it should be possible to suppress the influence of extraneous fields when the induction windings are connected in such a way as to compensate for the influence of extraneous fields. However, the presence of two isthmuses makes manufacturing particularly complex and results in high power consumption.

The object of the invention is therefore to provide a simple, compact and precise device with low power consumption for isolated measurement of very high direct currents and also alternating currents in a broad bandwidth of the type mentioned in the introduction with increased interference suppression and small remanence effects as well as a method for isolated determination of current using such an aforesaid device.

This object is achieved with the device for measuring current according to claim 1 and the method for determining current according to claim 13.

The inventive device for measuring current is characterized in functional combination with the features mentioned in the introduction by the fact in particular that the magnetic core has at least one measuring region with at least two openings, which subdivide the measuring region into at least three adjacent flux paths, that at least two flux paths are wound by at least one exciter winding and that the measuring winding is wound around parts of the at least one measuring region.

With this device it is possible to determine the current intensity of the current-carrying primary conductor, for which purpose the device is designed to measure the current intensity of the compensating winding. The latter current intensity can be converted to the current intensity of the current-carrying primary conductor. Unless the current-carrying primary conductor is wound as one or more turns—as can also be provided—around one leg of the core, it should not be spaced too far from the device, in order to keep interfering influences of other elements generating magnetic flux as small as possible, and should not be routed through the openings of the measuring region or measuring regions. Preferably the current-carrying primary conductor should carry direct current, although the device is also designed to measure alternating currents of the current-carrying primary conductor.

The core, which on the whole is annular or rectangular, for example, and is made of a ferromagnetic material, for example, preferably has a closed cross section. By virtue of closed cross sections, it is possible to achieve particularly high permeability values, which leads to particularly high sensitivity. Thereby the magnetic flux generated in the core can be guided particularly well, thus positively influencing the measuring accuracy. Nevertheless, there are also application situations, for example when the device is exposed to the risk of severe shock, in which an open cross section may necessarily be provided—although a loss of measuring accuracy must be accepted. An air gap associated with the open cross section can then be provided preferably outside the measuring region. By virtue of such an air gap, not only can the aforesaid increase of resistance to shock effects be achieved but also developing remanence can be reduced.

In its at least one measuring region, the core has respectively at least two openings, which in the case of annular or rectangular cores can connect the top sides thereof with one another particularly simply, although connection of the side faces is also possible. The measuring regions are preferably relatively small compared with the overall size of the core, whereby any undesired interferences that may be caused in the measuring region (such as interfering fluxes, for example) have less influence on the core and on the device as a whole. The openings may be formed among other possibilities by circular bored holes or by openings with rectangular cross section. Each measuring region is subdivided into at least three adjacent flux paths by the at least two openings. One of those flux paths forms part of the measuring region or of the core in which a magnetic flux may be present, in which case it is possible to subdivide the core in one measuring region or in several measuring regions into three adjacent flux paths (if two openings are provided), four adjacent flux paths (if three openings are provided), and so on.

One compensating winding is mounted outside the at least one measuring region and around parts of the core, for example one leg of the core. Because of the compensating winding it is possible to pass a current that induces in the core a magnetic flux proportional thereto and amenable to regulation in such a way that the magnetic flux induced by the current-carrying primary conductor can be canceled out completely in the ideal case and at least approximately in practice. Under this prerequisite the current in the compensating winding is proportional to the current in the primary conductor. By means of an appropriate number of turns of the compensating winding, which in practice may typically be between 500 and more than 2000, it is possible to limit the current necessary for this cancellation to a fraction of the current flowing through the current-carrying primary conductor. This condition of the core or mode of operation of the device, referred to as "zero flux", permits a very accurate measurement.

The measuring region consists of at least three flux paths, of which at least two flux paths are wound by one common or two individual exciter windings. These wound flux paths may be either directly adjacent or else separated from one another by at least one flux path. With increasing total number of openings and flux paths in the at least one measuring region, it is accordingly possible to dispose a plurality of exciter windings.

The at least one exciter winding is designed to induce a magnetic flux in the wound flux paths and to influence their magnetic resistance in equivalent manner periodically with high frequency, which may lie in the two digit kHz range. The magnetic flux in these flux paths is preferably closed, meaning that, if the wound flux paths are compared, both of their magnetic fluxes respectively have the same amplitude but different orientations. Because of the high frequencies, a contribution is made to the ability to measure very rapidly changing currents of the primary conductor. The exciter winding is designed such that a corresponding exciter current can be passed through it in order to induce a magnetic flux in the flux path or flux paths wound by the exciter winding. Preferably the exciter winding is designed in such a way as to induce magnetic saturation of the wound flux path or wound flux paths. Furthermore, the at least one exciter winding can be designed to induce a magnetic flux of different orientation but equal amplitude in alternating manner in the at least one flux path wound by it, in which case a phase in which no magnetic flux is induced in the flux path can always be provided between the change of orientation of the magnetic flux. Hereby remanence effects can be reduced. The exciter winding makes it possible in particularly simple manner to modulate the flux path or flux paths wound by it magnetically or to saturate it of them magnetically, in which case it is possible at the same time to prevent, in other parts of the core, induction of undesired interfering fluxes, which reduce the measuring accuracy and may cause offset errors.

At least one measuring winding is wound around parts of the core in the measuring region. As an example, the measuring winding may be wound around a single flux path or else around several flux paths of the at least one measuring region. In this connection, it is possible for the measuring winding to be wound around flux paths around which an exciter winding is already wound. Likewise it is provided that a measuring winding is wound around one or more flux paths around which no exciter winding is wound.

The measuring winding is used for sensing a changing magnetic flux in the part of the core wound by the measuring winding. For this purpose it is possible to induce, in the measuring winding, an alternating current or an alternating voltage that is proportional to the change of the magnetic flux in the part of the core wound by the measuring winding. The change of the said magnetic flux is dependent on the difference between the induced magnetic fluxes of the current-carrying primary conductor and the compensating winding (differential flux), and it may be used for regulation of the current of the compensating winding. The change of the magnetic flux in the flux path wound by the measuring winding is caused by the energization of the at least one exciter winding, which also has an influence on the value of the magnetic flux. Current of the current-carrying primary conductor can be determined particularly accurately with the inventive measuring winding.

The number of turns of the measuring winding is freely selectable, but the measuring accuracy can be increased with increasing number of turns.

In a first embodiment of the inventive device for measuring current, the device has a measuring region with two openings subdividing the measuring region into three adjacent flux paths, one exciter winding wound with different orientation around two flux paths and one measuring winding wound around the other flux path.

The two openings subdivide the measuring region of the core into three adjacent flux paths, one flux path of which is preferably routed between the openings and two further flux paths are respectively bounded by one of the openings and an inner or outer rim of the core. One exciter winding is wound with different orientation around two of the flux paths, with the result that a closed magnetic flux can be induced particularly simply and particularly effectively in the flux paths wound by it. In this connection it is possible for the exciter winding to be wound around two adjacent flux paths. However, it is also provided that the exciter winding is wound around two flux paths that are not directly adjacent but instead the other flux path lies between them. The exciter winding is routed along one of the two wound flux paths in one winding direction and along the other flux path in opposite direction. Preferably the wire is then routed largely symmetrically to a point between the flux paths at which the exciter winding crosses itself. This exciter winding may be wound either one or more times around the flux paths, in which case it is also possible that one of the flux paths is wound more with more turns than the other flux path.

The exciter winding is able periodically to change the magnetic resistance of the pair of flux paths or to saturate these flux paths magnetically. In this connection the described route of the exciter winding around the two flux paths favors a situation in which, when the exciter winding is in energized condition, the magnetic flux of the one wound flux path has a direction opposite or an amplitude equal to that of the magnetic flux of the other wound flux path. The exciter winding is designed so as to increase (in the energized condition) and to decrease (in the non-energized condition), in the measuring region within the other flux path, the magnetic flux corresponding to the difference between the magnetic fluxes that were induced by the primary conductor and the compensating winding. This increase or decrease of the magnetic flux can be induced as an alternating current or alternating voltage in the measuring winding, whereby the compensating current of the compensating winding can be regulated in the manner described in the foregoing.

The first embodiment of the inventive device for measuring current is characterized in particular by the fact that, by a single exciter winding in two flux paths of the measuring region of the core, it is possible to generate an almost closed magnetic flux, which has opposite direction but the same amplitude in the two flux paths. In the ideal case, the magnetic fluxes are externally canceled out in this way, and no magnetic interfering flux is induced by the exciter winding in other regions of the magnetic core. Such an exciter winding has the advantage that only one current source is necessary to energize the exciter winding, and that time and effort for tuning the currents in two energized windings is not required. Preferably the flux paths wound by the exciter winding have the same size, so that the exciter winding can be routed symmetrically in simple manner and an almost closed magnetic flux can be achieved in the flux paths wound by the exciter winding.

In a second embodiment of the inventive device, the device has two measuring regions with respectively two openings subdividing the measuring regions into three adjacent flux paths, two exciter windings wound with different orientation around respectively two flux paths of the measuring regions, one measuring winding wound around the other flux path of one of the measuring regions and/or one measuring winding wound around the other flux path of the other measuring region.

This second embodiment has two successive measuring regions, which considered individually correspond to the measuring regions of the first improvement with the aforesaid properties and advantages. One measuring winding is already sufficient for functional capability of the device, but in the embodiment with two measuring windings these are disposed in series and are able to deliver an output signal with as much as double the frequency compared with the embodiment with one measuring winding. This has a positive influence on the reaction time of the device for sensing changing primary currents. The second embodiment is advantageous in particular when the exciter windings are energized alternately. The energizations of the exciter windings can then be matched to one another in such a way that, when a current is passed through the one exciter winding, no current is passed through the respective other exciter winding. Thereby it is possible in particularly simple manner to suppress, in the rest of the device, noise caused by interfering fluxes of the exciter winding in the energized condition.

In a third embodiment of the invention, the device for measuring current has a measuring region with three openings subdividing the measuring region into a first pair of adjacent flux paths and a second pair of adjacent flux paths as well as two exciter windings wound with different orientation around respectively one pair of adjacent flux paths.

This third embodiment is characterized in that all paths of the one measuring range are wound by two exciter windings. This arrangement is particularly advantageous when the exciter windings are energized alternately. As in the successive measuring regions described hereinabove, the energization of the exciter windings can be matched to one another in such a way that, when a current is passed through the one exciter winding, no current is passed through the respective other exciter winding. Thereby it is possible in particularly simple manner to suppress, in the rest of the device, noise caused by interfering fluxes of the exciter winding in the energized condition.

In a first further improvement of the third embodiment, one measuring winding is wound around the first pair of adjacent flux paths and/or one measuring winding is wound around the second pair of adjacent flux paths. In the embodiment with two measuring windings, respectively one exciter winding and one measuring winding share two flux paths. Thereby the device is in position, with alternating energization of the first and second exciter winding, to modulate the magnetic resistance of the pair of adjacent flux paths magnetically in alternation, by reducing their magnetic resistance during an energization and increasing it again during return to the non-energized condition, and to sense the change of magnetic flux induced thereby in both pairs of adjacent flux paths (in the case of two measuring windings) or in one pair of adjacent flux paths (in the case of one measuring winding). One measuring winding is already sufficient for functional capability of the device. If two measuring windings are provided in the manner indicated in the foregoing, they are able to deliver an output signal with as much as double the frequency compared with the embodiment with one measuring winding. This has a positive influence on the reaction time of the device for sensing changing primary currents. By means of this improvement it is further possible to dispose a measuring region with four flux paths, two exciter windings and one measuring winding or two measuring windings in particularly space-saving manner on the core.

A second improvement of the third embodiment is characterized in that the middle of the three openings has a larger extent than the flux paths and thereby defines a first common extension of the first pair of adjacent flux paths and a second common extension of the second pair of adjacent flux paths, that one measuring winding is wound around the first common extension and/or that one measuring winding is wound around the second common extension.

The two pairs of flux paths merge respectively in a common flux path, which is referred to as the common extension. The common extensions are separated from one another by the middle opening. Because of the fact that the measuring winding or the measuring windings is or are wound around one common extension or respectively common extensions, the exciter winding or the exciter windings can be spaced well apart from the measuring winding or measuring windings, thus decreasing the risk that the exciter windings will have an undesired influence on the measuring winding or measuring windings. As regards alternating energization of the exciter windings in the case of provision of one measuring winding or two measuring windings, the second improvement of the third embodiment has the same functionalities and advantages as the first improvement of the third embodiment.

In a further embodiment of the device for measuring current, it is provided that the at least one exciter winding is connected to a modulator unit. The modulator unit connected to the exciter winding serves as a current source for inducing the magnetic flux described in the foregoing in the flux paths wound by the at least one exciter winding, in which case corresponding currents can preferably have sufficiently high values to lead to magnetic saturation of the flux paths. As an example, a digital frequency generator may be provided as the modulator unit.

In the simplest case, the modulator unit can be designed to deliver a current that can be turned on and off periodically. By means of such an output signal, the exciter winding can be operated in such a way that the modulator unit periodically passes a current through the exciter winding in order to induce a magnetic flux with the same frequency in the flux paths. Thereby it is possible to raise and lower the magnetic resistance of the flux paths periodically, and so the flux paths can be periodically saturated magnetically with sufficiently high currents.

Likewise the use of a modulator unit capable of delivering a rectangular or trapezoidal current with alternating positive and negative current of equal amplitude is provided. Between the changeover from positive to negative current and vice versa, a phase, which preferably should always have the same duration, is always provided in which the modulator unit does not send out any current signal and in which no current is supposed to flow through the exciter winding. The modulator unit is designed so as to pass a corresponding rectangular or trapezoidal current through the exciter winding in order to induce a magnetic flux proportional thereto with alternating orientation but the same amplitude in the flux paths at the frequency of the change of sign of the said current. This alternating magnetic flux is particularly suitable for reducing remanence effects in the flux paths and noise in the rest of the device. The functionalities and advantages described in the foregoing can also be achieved with modulator units that deliver currents of other form, such as triangular or sinusoidal currents.

As an example, the modulator unit may have a current source for sending out the current signals described in the foregoing as well as a modulator connected to and controlling the current source. For example, the modulator may be integrated in the modulator unit or connected as an external modulator to the current source. In particular, the modulator should be designed so as to control which output signal the modulator unit delivers. Thereby it is possible in particularly flexible manner to control or synchronize both the current source and other elements of the device for measuring current commonly by means of the modulator.

It is further advantageously provided that a demodulator is connected to the at least one measuring winding and that it can be synchronized with the modulator unit. The demodulator makes a contribution to supplying the compensating current in the compensating winding. By means of the demodulator, the alternating current induced in the measuring winding can be received, changed and output. For example, it is possible to provide a demodulator in the form of an analog reversing switch, which is designed to invert individual phases of the alternating current in such a way that the demodulator functions in the sense of a rectifier. The demodulator can be synchronized with the modulator unit, i.e. the time control of the modulator unit can be applied to the demodulator in its function in question. Thus the induction of magnetic flux in the flux paths wound by the at least one exciter winding can be matched to the operation of the demodulator. For this purpose the demodulator and the demodulator can be connected to one another in a particularly practical manner. However, synchronization can also be achieved in other ways without the need for a connection between the demodulator and the modulator unit.

Furthermore, it is advantageous when an integrator is connected to the demodulator. The integrator is designed to receive the signals output by the demodulator, to change them by integration and to output them. As an example, the integrator can have the form of a rectifier with parallel capacitor (for smoothing). In this case the integrator can be designed to convert an alternating-current signal received by the demodulator into a direct-current signal. Moreover, the integrator can function as a low-pass filter. By means of the integrator it is possible to achieve particularly precise regulation of the compensating current of the compensating winding.

Furthermore, it is advantageous when a first operational amplifier is connected to the compensating winding and an output. By means of the first operational amplifier, the compensating current of the compensating winding can flow and be converted into an output voltage proportional to the compensating current. For this purpose, a resistor that determines the conversion ratio is preferably provided in a feedback loop. By means of the first operational amplifier it is possible to cancel out high-frequency (measured) signals of the primary conductor. Alternatively, the output may also be connected directly to the compensating winding, so that the compensating current can be drawn directly at the output in particularly simple manner.

It is further advantageous when the integrator is connected to the compensating winding. Thereby the direct current of the integrator can be supplied in particularly simple manner to the compensating winding. The direct current then corresponds to the compensating current, by means of which the zero-flux condition in the core can be achieved. Herewith a contribution is made to reducing remanence effects in the core.

Furthermore, it is advantageously provided that the integrator is connected to a second operational amplifier, which is connected to the compensating winding and the first operational amplifier. The voltage drop—caused by the resistance of the compensating winding—can be canceled out by the second operational amplifier. Furthermore, the use of several very thin turns is possible, whereby the device can be dimensioned more compactly. Moreover, it is possible to use turns that have a higher resistance, which can be canceled out by the second operational amplifier in the form of a correspondingly amplified voltage. By means of the combination of the first and second operational amplifiers it is possible to achieve operation of the device in a high frequency bandwidth, e.g. between a range of 0.1 Hz and the MHz range. Use of the connection of the first and second operational amplifier as well as the integrator, although already not obvious considered in itself, is also conceivable—with similar or identical advantages—when a signal is supplied to the integrator by means other than those described in the foregoing.

According to a further advantageous embodiment, it is provided that the measuring winding comprises an analog-to-digital converter. As an example, the analog-to-digital converter can be attached to one end of the measuring winding and connected to the demodulator. The analog-to-digital converter is designed to convert the changes of magnetic flux sensed by the measuring winding into digital signals and to make them available to the demodulator attached to the measuring winding and thereby also to the integrator and the operational amplifiers. In this way it is possible to adjust the compensating current by digital regulation technology and to avoid the temperature drifts that may be caused by the analog embodiment. In this connection, it is further particularly advantageous to provide that the demodulator is implemented as a completely digital component. Likewise it may be advantageously provided that a feedback regulator, such as a PI regulator or PID regulator, be used instead of the integrator.

Particularly advantageously, it is further provided that the first operational amplifier and the second operational amplifier are implemented together as digital and analog components. For example, it is possible to provide a digital end stage resembling a full bridge, which operates both ends of the compensating winding with analog feedback operational amplifiers. By means of this feedback, the voltage or the current intensity in the compensating winding can be fed back to the digital part of the operational amplifiers for regulation of the digital output.

The method for determining current using a device described in the foregoing to measure current comprises the following process steps Passing a primary current through the primary conductor and thereby inducing a magnetic flux in the core;

Passing a compensating current through the compensating winding and thereby inducing a magnetic flux in the core, in order to counteract the magnetic flux induced by the primary conductor;

Periodically energizing the at least one exciter winding and thereby, to the extent energized, inducing a magnetic flux in at least two flux paths wound by the at least one exciter winding and thereby modulating the said flux paths magnetically;

Sensing, by means of the at least one measuring winding, the change of the magnetic flux between various energization conditions of the exciter winding, in order to tap a demodulation signal for regulation of the magnetic flux induced by the compensating winding;

Setting the compensating current to a value such that the change of magnetic flux sensed by the measuring winding is minimized;

Measuring the compensating current;

Calculating the primary current from the compensating current.

By means of the primary conductor, it is possible to pass a current known as the primary current. The primary current is supposed to be determined by the method for determining current by means of a device for measuring current. The distinction between measurement and determination is made because the primary current is not measured directly in the course of the method, but instead can be calculated from the compensating current.

The primary current induces in the core a magnetic primary flux that is proportional to the primary current and acts opposite to a magnetic compensating flux induced in the core by the compensating winding. For this purpose a corresponding compensating current is passed through the compensating winding. The difference between primary current and compensating current yields a differential current, which corresponds to a magnetic differential flux in the core. When the device is in the zero-flux condition, in which the primary flux is canceled out by the compensating flux, no energy of the current-carrying primary conductor is consumed.

The at least one exciter winding is energized periodically. The exciter winding is energized by the fact that an exciter current is passed through it. Exciter currents may be not only unipolar but also in particular bipolar exciter currents, which have a symmetric profile in time, a mean value of zero and preferably a phase in which no energizing signal is generated and preferably always has the same length between the changes of sign. Examples of suitable bipolar energizations are exciting currents with rectangular, trapezoidal, triangular or sinusoidal form.

The periodic excitation can be energized in the following unipolar manner, for example, by the modulator unit as described in the foregoing: The energization consists of two phases, wherein a direct-current signal is passed through the exciter winding in one phase and no current is passed through the exciter winding in the second phase. In this connection, all phases can have the same duration. The direct-current signal has the same orientation and amplitude in each energized phase. In the flux paths wound by the exciter winding, a magnetic flux proportional to the direct-current signal is induced thereby and modulates the magnetic resistance of the flux paths. Thus an increase of the magnetic flux can be used to lower the magnetic conductivity of the flux paths, thus potentially leading to magnetic saturation of the flux paths during injection of correspondingly high currents. With correspondingly adapted variation of the magnetic flux in the flux paths, it is also possible to excite the exciter winding periodically with a current signal that in each energized phase has the same amplitude but opposite orientation and that exhibits a phase of preferably the same duration with no energization between the changes of sign (bipolar energization).

If the exciter winding is not energized, the differential flux becomes distributed over all flux paths of the at least one measuring region. If the exciter winding is in the energized condition, the magnetic flux rises in the flux paths that at this instant are not magnetically modulated by an exciter winding, because the magnetic conductivity of the magnetically modulated flux paths is lowered. Upon return to the non-energized condition, the differential flux becomes distributed over all flux paths once again and the magnetic flux in the flux path that previously was not magnetically modulated decreases once again.

When an implemented core deviates from the described theoretical design, an interference signal (in the form of an alternating voltage or alternating current), which is proportional to the exciter current and becomes superposed on the current induced in the measuring winding, may develop.

The change of the magnetic flux is sensed in parts of the measuring region by means of the at least one measuring winding. By sensing it is understood that a measuring signal in the form of an alternating voltage or alternating current is induced in the measuring winding. The measuring signal is proportional to the change, in the part of the measuring region wound by the measuring winding, of the magnetic flux between various energization conditions. The frequency of the alternating voltage or alternating current corresponds to the frequency of energization of the exciter windings. A demodulated signal, with which the compensating current passed through the compensating winding can be regulated, is tapped from the measuring signal, whereby the compensating flux counteracting the primary flux is induced in the core. The compensating current is regulated in such a way that the change of the magnetic flux sensed by the at least one measuring winding tends to zero.

The regulation of the compensating current can be achieved by the fact, due to the measuring signal induced in the measuring winding, it receives a feedback signal, on the basis of which the compensating current is corrected. The intention is to achieve a situation in which the magnetic flux in the part of the measuring region wound by the measuring winding does not change (target value). When this is the case, the zero-flux condition is achieved in the core. The actual value of the change of the magnetic flux is supplied via the measuring signal (actual value).

Finally, the compensating current or a voltage proportional thereto can be measured by suitable means such as, for example ammeters or voltmeters or computer units and then the primary current can be determined.

Within the scope of the inventive method, it is particularly advantageous to provide that two exciter windings wound respectively around two flux paths are operated in opposition. This method is possible when the exciter windings are operated in unipolar or bipolar manner. The energization of the exciter windings can be matched to one another in such a way that, when a current is passed through the one exciter winding, no current is passed through the respective other exciter winding. Thereby it is possible in particularly simple manner to suppress, in the rest of the device, noise caused by interfering fluxes of the exciter winding in the energized condition.

Furthermore, it is advantageous to connect, by means of the demodulator, the ends of the measuring winding alternately to the input of the integrator. In this way the phases of the measuring signal induced in the measuring winding can be inverted particularly simply, so that the demodulator acts in the sense of a rectifier. In a further advantageous improvement of this method, the demodulator is synchronized with the modulator unit. The demodulator and the modulator unit can then be operated with the same frequency. The demodulator then fulfills the function of a multiplier, controlled by the modulator unit, which modulates the measuring signal of the measuring winding.

Furthermore, it is advantageously provided that the output signal of the demodulator is converted by means of the integrator into the compensating current. The integrator receives the signal output by the demodulator and converts it into a direct current, which is injected as compensating current into the compensating winding. The compensating current generated in this way is characterized by particularly high precision.

Moreover, it is advantageous when the output signal of the demodulator is converted into the compensating current by means of the integrator and the second operational amplifier, which receives a feedback signal from the first operational amplifier. Hereby the voltage drop caused by the resistance of the compensating winding can be canceled out and the measuring accuracy can be further improved by the reduction of the bandwidth to a few Hz or less.

A further advantageous embodiment of the inventive method is characterized by measurement of the inductance of the at least one exciter winding and generation of a signal that indicates whether or not the respective measured inductance lies within a specified range. By virtue of its inductance, a voltage component in the exciter winding can be sensed, for example if the current flowing through the exciter winding is reversed or changed, in which case the value of the inductance depends on the permeability of the core. The permeability changes inversely relative to the magnetic flux in the core, and so it is possible to sense magnetic saturation of the core, which would cause tracking of the primary current to be incorrect and therefore to lie outside a permissible range. As an example, the voltage component can be determined by a comparator, which the difference between a reference voltage (namely the voltage applied to the exciter winding by the modulator unit) and the voltage that is induced by the exciter winding on the basis of the residual magnetic flux (namely generated by the primary current) and is dependent on the latter in the core. The voltage component can be used as an indicator of the compensation of the primary current by the indicator current. In this connection, the specified range can comprise acceptable values for determined voltage components. As an example, the signal may be an output signal readable by other devices or an optical display, which in a particularly simple case can display two different conditions, namely those in which a respectively measured inductance value lies or does not lie within a specified range.

And, finally, the present invention also relates to a magnetic switch of a magnetic core with a measuring region that has at least two openings that subdivide the measuring region into at least three adjacent flux paths, comprising at least one exciter winding connected to a modulator unit. Either two individual exciter windings are wound in the measuring region around respectively one individual flux path or one exciter winding is wound in the measuring region around two flux paths. The at least one exciter winding can be energized periodically by means of the modulator unit in order, to the extent that it is energized, to induce a magnetic flux in two of the flux paths wound by the at least one exciter winding.

The exciter winding connected to the modulator unit represents a magnetic switch, which can open and close the flux path or the flux paths for magnetic flux. If the exciter winding is energized by the modular unit so that it induces a magnetic flux in the flux path or in the flux paths, thus leading to magnetic saturation thereof, the magnetic switch is said to be opened. If the exciter winding is not energized, it does not induce any magnetic flux in the flux path or flux paths, so that this or these is or are not magnetically saturated, and the magnetic switch is said to be closed. In a particularly advantageous embodiment of the magnetic switch, an exciter winding is wound with different orientation around the two flux paths. As regards further advantages and preferred improvements of the inventive magnetic switch, obviously all aspects already explained in connection with the inventive device apply, and so to avoid repetition they are incorporated here by reference.

Figure 2:
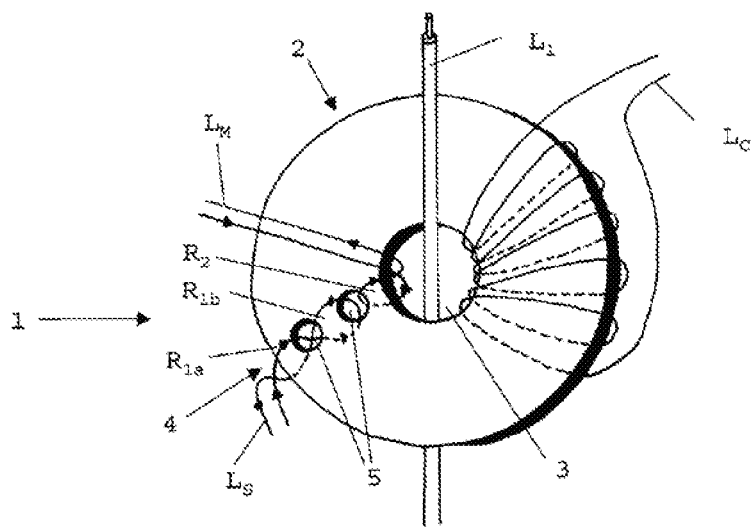
Figure 3:
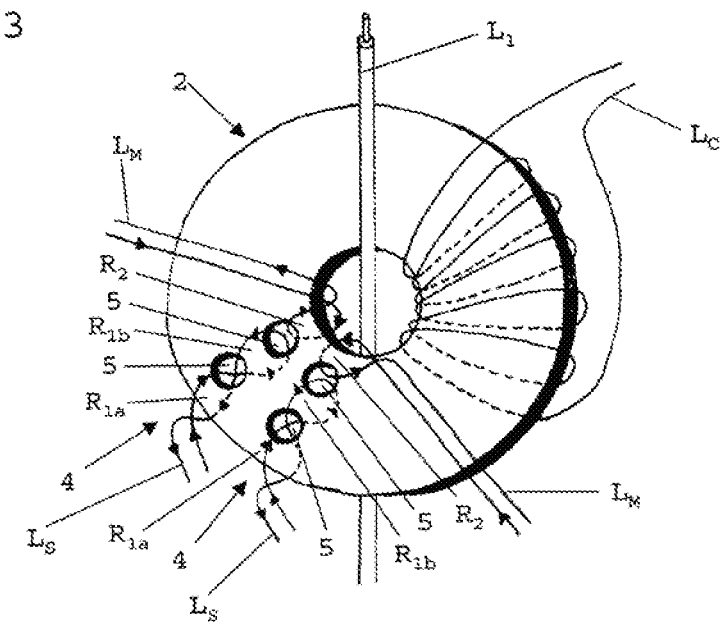
Figure 4:
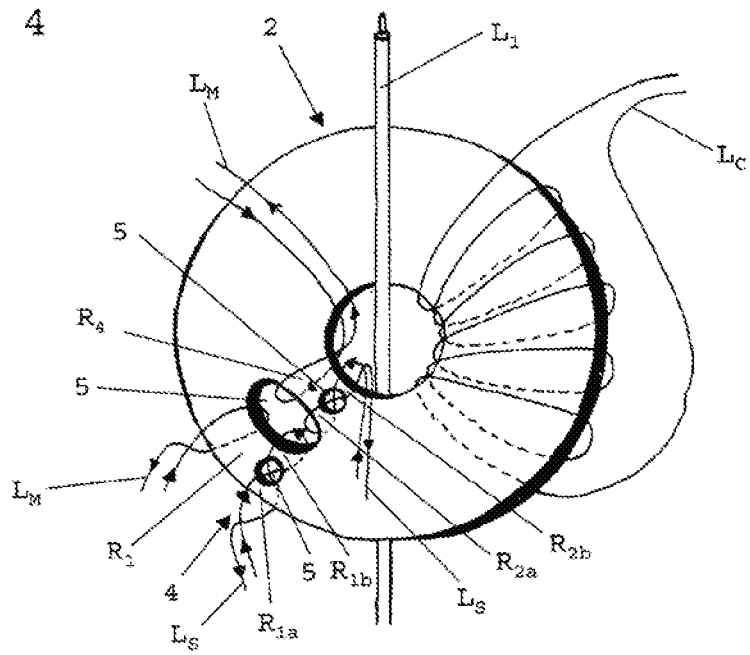
Figure 5:
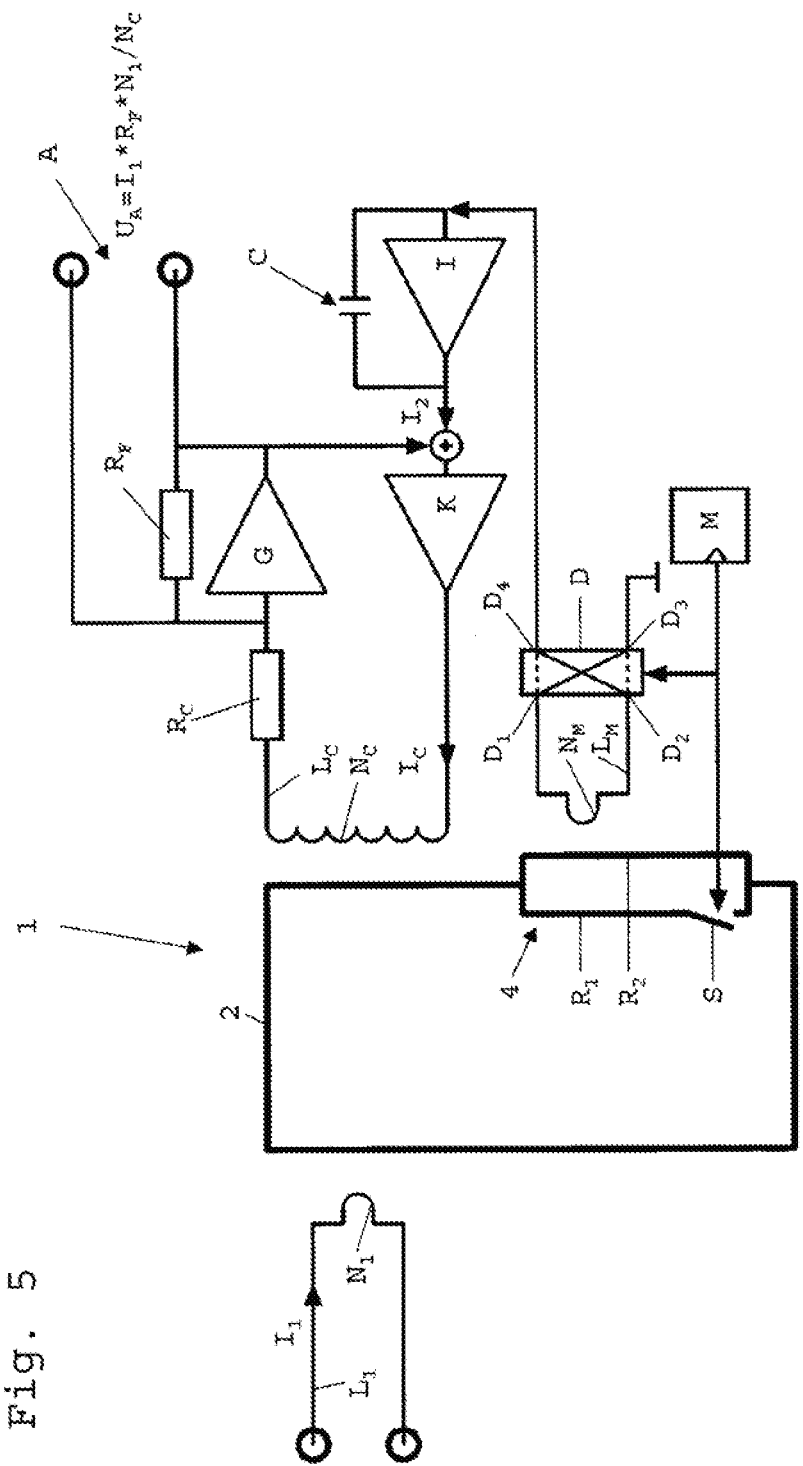
Figure 6:
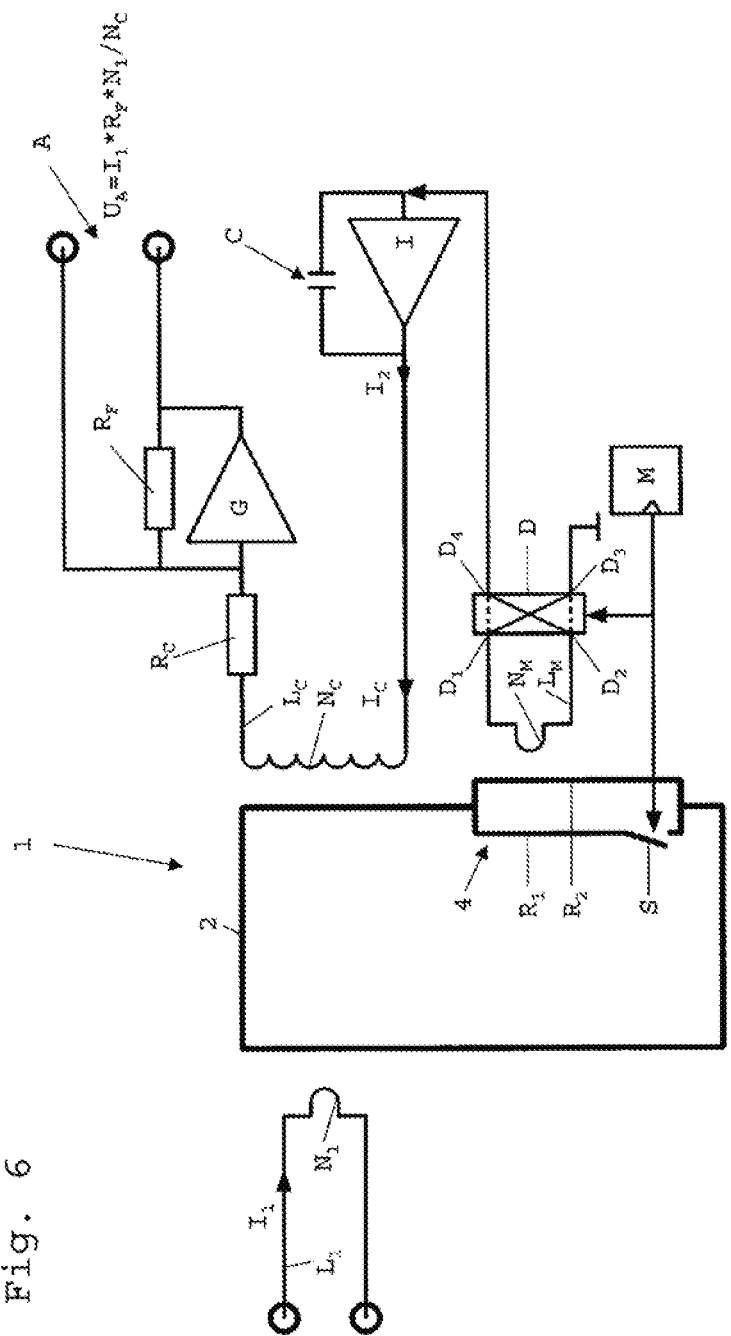
Figure 7:
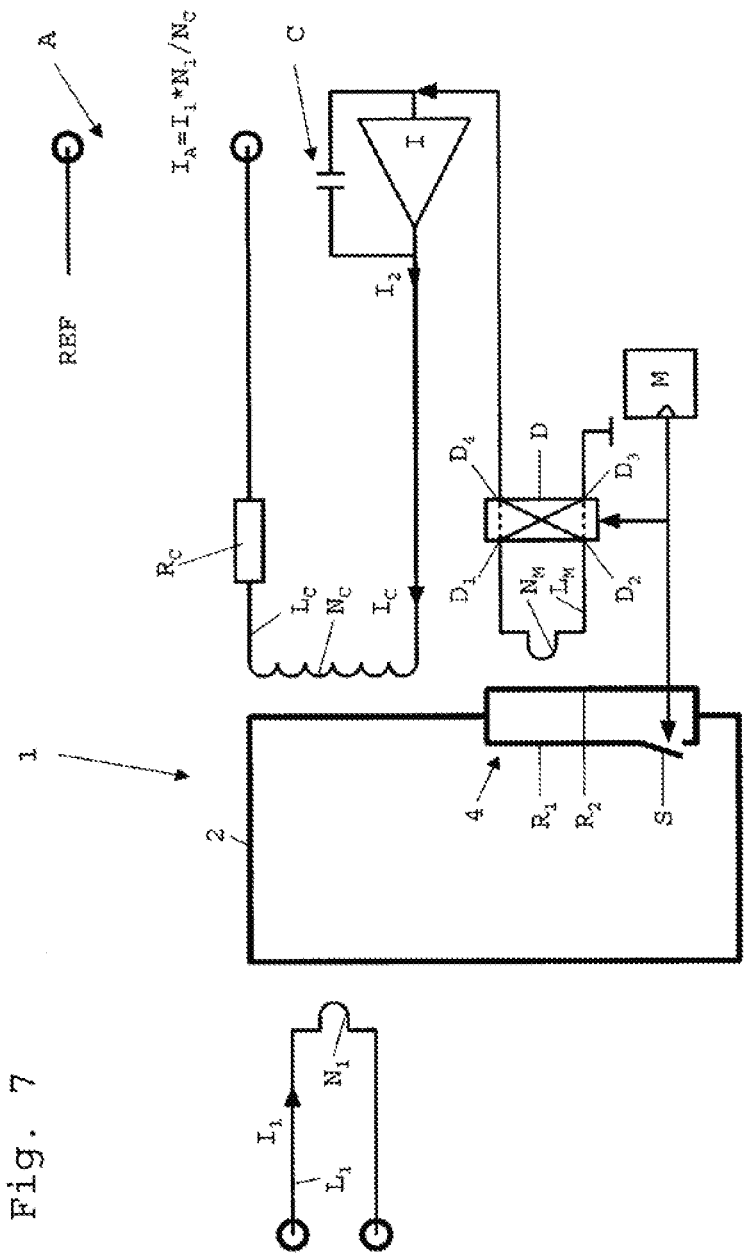
Figure 8:
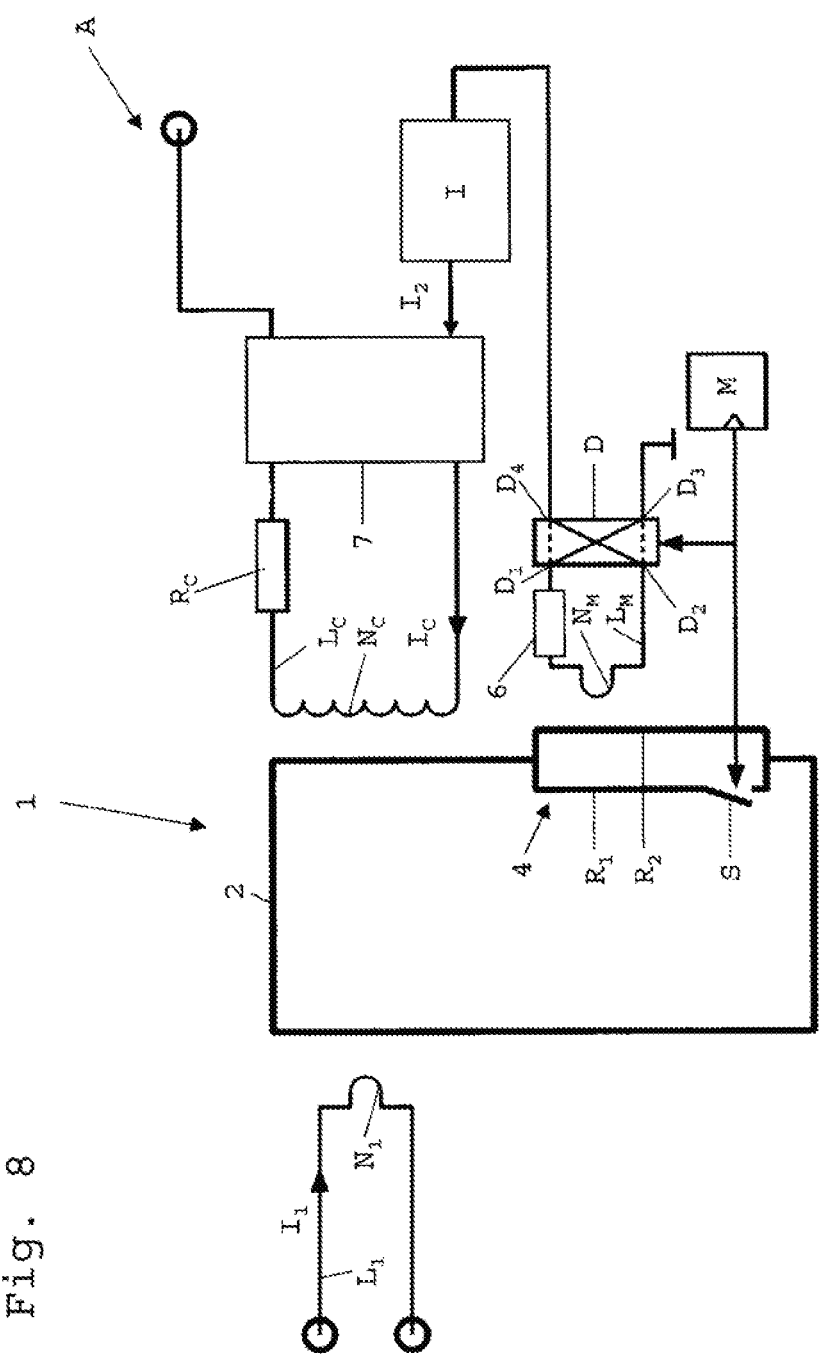

Exemplary embodiments of the invention are explained in more detail hereinafter on the basis of the drawing, wherein:

FIG. 1 shows a schematic perspective view of an inventive device for measuring current with two openings disposed in a measuring region, two exciter windings wound respectively around one flux path and one measuring winding wound around a third flux path, FIG. 2 shows a schematic perspective view of a first embodiment of an inventive device for measuring current with one exciter winding wound with different orientation around two flux paths and one measuring winding wound around a third flux path, FIG. 3 shows a schematic perspective view of a second embodiment of an inventive device for measuring current with two successive measuring regions, FIG. 4 shows a schematic perspective view of a third embodiment of an inventive device for measuring current with three openings disposed in a measuring region and two measuring windings wound around common extensions of flux paths, FIG. 5 shows a schematic circuit diagram of a further embodiment of an inventive device for measuring current, FIG. 6 shows a schematic circuit diagram of an embodiment similar to the embodiment according to FIG. 5, without second operational amplifier, FIG. 7 shows a schematic circuit diagram of an embodiment similar to the embodiment according to FIG. 6, for direct output of the compensating current, and FIG. 8 shows a schematic circuit diagram of a further embodiment of an inventive device for measuring current with an analog-to-digital converter and alternatively configured operational amplifiers.

The inventive device 1, illustrated in FIG. 1, for measuring current has a closed magnetic core 2 of generally rectangular shape with an opening 3, through which a primary conductor $L_1$ is routed. Two openings 5 are disposed in a measuring region 4, subdividing measuring region 4 into three adjacent flux paths $R_{1a}$, $R_{1b}$, $R_2$. To illustrate its extent, measuring region 4 is marked off from the rest of the core by a dashed line in FIG. 1. A compensating winding $L_C$ is wound outside measuring region 4 around a leg 6 of core 2. Two exciter windings Ls are wound around two flux paths $R_{1a}$, $R_{1b}$ and one measuring winding $L_M$ is wound around the other flux path $R_2$.

The first embodiment, illustrated in FIG. 2, of an inventive device 1 for measuring current has a closed magnetic core 2 of generally annular shape, through which a primary conductor $L_1$ is routed. Two openings 5 are disposed in a measuring region 4, subdividing measuring region 4 into three adjacent flux paths $R_{1a}$, $R_{1b}$, $R_2$. A compensating winding $L_C$ is wound outside measuring region 4 around core 2. A single exciter winding $L_S$ is wound with different orientation around two flux paths $R_{1a}$, $R_{1b}$ and one measuring winding is wound around the other flux path $R_2$.

The second embodiment, illustrated in FIG. 3, of an inventive device 1 for measuring current has a closed magnetic core 2 of generally annular shape, through which a primary conductor $L_1$ is routed. Two openings 5 respectively are disposed in two identical measuring regions 4, subdividing measuring regions 4 into respectively three adjacent flux paths $R_{1a}$, $R_{1b}$, $R_2$. Two exciter windings $L_S$ are wound with different orientation around respectively two flux paths $R_{1a}$, $R_{1b}$ for the purpose of opposite energization and two measuring windings LM are wound around the respective other flux path $R_2$ of measuring regions 4.

The third embodiment, illustrated in FIG. 4, of an inventive device 1 for measuring current has a closed magnetic core 2 of generally annular shape, through which a primary conductor $L_1$ is routed. Three openings 5 are disposed in a measuring region 4, subdividing measuring region 4 into a first pair of adjacent flux paths $R_{1a}$, $R_{1b}$ and a second pair of adjacent flux paths $R_{2a}$, $R_{2b}$. Respectively one exciter winding $L_S$ is wound with different orientation around the first pair of adjacent flux paths $R_{1a}$, $R_{1b}$ and the second pair of adjacent flux paths $R_{2a}$, $R_{2b}$ for the purpose of opposite energization. The middle of the three openings 5 has a greater extent than flux paths $R_{1a}$, $R_{1b}$, $R_{2a}$, $R_{2b}$ and thereby defines a first common extension $R_1$ of the first pair of flux paths $R_{1a}$, $R_{1b}$ and a second common extension $R_4$ for the second pair of adjacent flux paths $R_{2a}a$, $R_{2b}$. Respectively one measuring winding $L_M$ is wound around the first common extension $R_1$ and the second common extension $R_4$.

The circuit diagram, illustrated in FIG. 5, of a further embodiment of a device 1 for measuring current has a primary winding in the form of a primary conductor $L_1$, which can carry a primary current $I_1$ and has one turn $N_1$. To the extent that it carries a primary current $I_1$, primary conductor $L_1$ induces a magnetic primary flux $\varphi_1$ proportional to the said current in a closed magnetic core 2. A compensating winding $L_C$ with a plurality of turns $N_C$, which have a total resistance $R_C$, is wound around core 2. A compensating current $L_C$, which induces in the core a magnetic compensating flux $\varphi_C$ that counteracts primary flux $\varphi_1$, flows through compensating winding $L_C$. The difference between primary flux $\varphi_1$ and compensating flux $\varphi_C$ is the differential flux $\Delta\varphi$, and the difference between primary current $I_1$ and compensating current $I_C$ is the differential current $\Delta I$.

Core 2 is subdivided in a measuring region 4 into three flux paths $R_1$, $R_2$, of which one of the flux paths $R_1$ comprises two flux paths $R_{1a}$, $R_{1b}$, not illustrated. An exciter winding—as illustrated in FIG. 2, for example—is wound with different orientation around the two flux paths $R_{1a}$, $R_{1b}$ and connected to a modulator unit M. Modulator unit M is designed to energize the exciter winding periodically, in which case the latter in the energized condition induces a magnetic flux in flux paths $R_{1a}$, $R_{1b}$, as a result of which flux paths $R_{1a}$, $R_{1b}$ become magnetically saturated. The exciter winding is a magnetic switch S, which can open and close flux paths $R_{1a}$, $R_{1b}$ for magnetic flux. If the exciter winding is energized, so that it induces a magnetic flux in flux paths $R_{1a}$, $R_{1b}$, leading to magnetic saturation thereof, magnetic switch S is said to be open. If the exciter winding is not energized, it does not induce any magnetic flux in flux paths $R_{1a}$, $R_{1b}$, and so these are not magnetically saturated and magnetic switch S is said to be closed.

A measuring winding $L_M$ is wound with several turns $N_M$ around flux path $R_2$. A measuring signal in the form of an alternating voltage or alternating current is induced in measuring winding $L_M$ by periodic opening and closing of the magnetic switch (synonymous with periodic energization of the exciter winding). If no compensating current $I_C$ is yet passing through compensating winding $L_C$, the differential flux $\Delta\varphi$ corresponds to the primary flux $\varphi_1$. The measuring signal is then proportional to primary current $I_1$. If a compensating current $I_C$ is passed through compensating winding $L_C$, the measuring signal is proportional to differential current $\Delta I$.

FIG. 5 shows a very simple embodiment of a demodulator D in the form of an analog reversing switch. The measuring signal of measuring winding $L_M$ is supplied to two inputs $D_1$, $D_2$ of demodulator D, which also has two outputs $D_3$, $D_4$. The demodulator converts the measuring signal into a demodulated signal. The demodulator can be switched alternately between two switched positions. In a first switched position, input $D_1$ is connected to output $D_4$ and input $D_2$ is connected to output $D_3$, the signal of which is supplied to a reference signal (ground). In a second switched position, input $D_1$ is connected to output $D_3$ and input $D_2$ connected to output $D_4$. The frequency at which demodulator D changes switched positions is synchronized with the energization frequency of modulator unit M. By means of the switching of demodulator D, the phases of the measuring signal are inverted in such a way that a demodulated signal having largely a constant sign is output by demodulator D.

Output $D_4$ is connected to the input of an integrator I, in the feedback loop of which a capacitor C is disposed. Integrator I functions as a low-pass filter. The output signal of integrator I is a direct current $I_2$, which is converted by a first operational amplifier G and a second operational amplifier K to a compensating current $I_C$. First operational amplifier G, which has a resistor $R_F$ in its feedback loop, is connected to one end of compensating winding $L_C$ and it has an amplification factor G. Second operational amplifier K has an amplification factor K and is connected to the other end of compensating winding $L_C$ and the output of integrator I. Direct current $I_2$ is superposed by the output signal of first operational amplifier G and is then amplified by operational amplifier K with its amplification factor K.

Finally, device 1 has an output A, at the terminals of which an output voltage $U_A$, which is proportional to primary current $I_1$ of current-carrying primary conductor $L_1$, is present. Output voltage $U_A$ has the value $U_A = I_1 * R_F * N_1 / N_C$. On the basis of output voltage $U_A$, primary current $I_1$ can be measured, calculated and displayed by connecting suitable means (not illustrated).

The circuit diagram, illustrated in FIG. 6, of a further embodiment of a device 1 for measuring current differs from the embodiment shown in FIG. 5 by the fact that a second operational amplifier K is not provided. Furthermore, two individual exciter windings are wound around the two flux paths $R_{1a}$, $R_{1b}$ (as illustrated in FIG. 1) and connected to the modulator unit. The two exciter windings together form a magnetic switch S, which can open and close flux paths $R_{1a}$, $R_{1b}$ for magnetic flux, as in the embodiment according to FIG. 5. Integrator I is connected directly to compensating winding $L_C$. The functional difference of device 1 consists in the fact that, in the exemplary embodiment shown in FIG. 6, direct current $I_2$, which is the output signal of integrator I, is supplied directly as compensating current $I_C$ to the compensating winding.

The circuit diagram, illustrated in FIG. 7, of a further embodiment of a device for measuring current differs from the embodiment shown in FIG. 6 by the fact that a first operational amplifier G is not provided, as a result of which compensating current $I_C = I_1 * N_1 / N_C$ is present directly at output A.

FIG. 8 shows a further exemplary embodiment, similar to the exemplary embodiments illustrated in FIGS. 5 to 7, of inventive device 1 for measuring current. The change of magnetic flux in measuring region 4 of magnetic core 2 is sensed by a measuring winding LM and supplied to an analog-to-digital converter 6 attached to one end of measuring winding $L_M$. The voltage component of the change of the magnetic flux is converted by analog-to-digital converter 6 into a digital signal. As an example, analog-to-digital converter 6 can be attached by an optional buffer or amplifier, not illustrated, to one end of measuring winding $L_M$. Analog-to-digital converter 6 is connected on the output side to a digital demodulator D and makes the converted digital signals available thereto.

The digital output signal of digital demodulator D is made available to an integrator I, which can have the form of an I, PI, PID regulator or any other suitable regulator. The output signal of integrator I is a digital signal, which represents direct current $I_2$ and is supplied to function unit 7.

In the illustrated exemplary embodiment, function unit 7 is implemented as a mixed digital and analog component as regards its signals. Function unit 7 comprises operational amplifiers G and K illustrated in FIG. 5 as well as a digital-to-analog converter, not illustrated, which convert the output signal of integrator I into an analog value and can supply the converted signal to first operational amplifier G or second operational amplifier K. As illustrated in FIG. 5, the operational amplifiers supply compensating current $I_C$ for compensating winding $L_C$. Compensating current $L_C$ is converted by suitable means in function unit 7 into a digital signal, which is available as the output signal at output A. Alternatively, it is also possible to provide that all components downstream from analog-to-digital converter 6, meaning demodulator D, integrator I and operational amplifiers G and K in function unit 7 are implemented as completely digital components.

What is claimed is:

1. A device (1) for measuring current, comprising:
  a magnetic core (2) with
    an opening (3) through which a primary conductor ($L_1$) is routed, and
    at least one measuring region (4) with at least two openings (5), which subdivide the measuring region (4) into at least three adjacent flux paths ($R_{1a}$, $R_{1b}$, $R_2$, $R_{2a}$, $R_{2b}$);
  a compensating winding ($L_C$), which is wound around parts of the core (2) outside the measuring region (4);
  at least two flux paths ($R_{1a}$, $R_{1b}$, $R_{2a}$, $R_{2b}$) of the same measuring region (4), wound by at least one exciter winding ($L_S$), wherein the at least one exciter winding is one common exciter winding or two individual exciter windings; and
  at least one measuring winding ($L_M$), which is wound around parts of the measuring region (4).

2. The device of claim 1, wherein:
  the at least one measuring region is one measuring region (4) with two openings (5) subdividing the measuring region (4) into the at least three adjacent flux paths ($R_{1a}$, $R_{1b}$, $R_2$),
  the at least one exciter winding ($L_S$) is one common exciter winding wound with different orientation around two flux paths ($R_{1a}$, $R_{1b}$) and
  the at least one measuring winding ($L_M$) is one measuring winding wound around the other flux path ($R_2$).

3. The device of claim 1, wherein:
  the at least one measuring region is two measuring regions (4) with respectively two openings (5) subdividing the measuring regions (4) into three adjacent flux paths ($R_{1a}$, $R_{1b}$, $R_2$),
  the at least one exciter winding is two exciter windings ($L_S$) wound with different orientation around respectively two flux paths ($R_{1a}$, $R_{1b}$) of the measuring regions (4),
  the at least one measuring winding is one measuring winding ($L_M$) wound around the other flux path ($R_2$) of one of the measuring regions (4) or
  one measuring winding ($L_M$) wound around the other flux path ($R_2$) of the other measuring region (4).

4. The device of claim 1, wherein:
  the at least one measuring region is one measuring region (4) with three openings (5) subdividing the measuring region (4) into a first pair of adjacent flux paths ($R_{1a}$, $R_{1b}$) and a second pair of adjacent flux paths ($R_{2a}$, $R_{2b}$) and the at least one exciter winding is two exciter windings ($L_S$) wound with different orientation around respectively one pair of adjacent flux paths ($R_{1a}$, $R_{1b}$, $R_{2a}$, $R_{2b}$).

5. The device of claim 4, wherein:
  one measuring winding ($L_M$) of the at least one measuring winding is wound around the first pair of adjacent flux paths ($R_{1a}$, $R_{1b}$) or
  one measuring winding ($L_M$) of the at least one measuring winding is wound around the second pair of adjacent flux paths ($R_{2a}$, $R_{2b}$).

6. The device of claim 4, wherein:
  the middle of the openings (5) has a larger extent than the flux paths ($R_{1a}$, $R_{1b}$, $R_{2a}$, $R_{2b}$) and thereby
    defines a first common extension ($R_1$) of the first pair of adjacent flux paths ($R_{1a}$, $R_{1b}$) and
    a second common extension ($R_4$) of the second pair of adjacent flux paths ($R_{2a}$, $R_{2b}$),
  one measuring winding ($L_M$) of the at least one measuring winding is wound around the first common extension ($R_1$) or
  one measuring winding ($L_M$) of the at least one measuring winding is wound around the second common extension ($R_4$).

7. The device of claim 1, wherein the at least one exciter winding ($L_S$) is connected to a modulator unit (M).

8. The device of claim 7, wherein a demodulator (D) is connected to the at least one measuring winding ($L_M$) and can be synchronized with the modulator unit (M).

9. The device of claim 8, wherein an integrator (I) is connected to the demodulator (D).

10. The device of claim 9, wherein the integrator (I) is connected to the compensating winding ($L_C$).

11. The device of claim 1, wherein an output (A) is connected directly or indirectly via a first operational amplifier (G) to the compensating winding ($L_C$).

12. The device of claim 11, wherein the integrator (I) is connected to a second operational amplifier (K), which is connected to the compensating winding ($L_C$) and the first operational amplifier (G).

13. The device of claim 11, wherein the first operational amplifier (G) and the second operational amplifier (K) are implemented together as digital and analog components.

14. The device of claim 1, wherein the measuring winding ($L_M$) comprises an analog-to-digital converter (6).

15. A method for determining current using the device of claim 1, the method comprising the following process steps:
  passing a primary current ($I_1$) through the primary conductor ($L_1$) and thereby inducing a magnetic flux in the core (2);
  passing a compensating current ($I_C$) through the compensating winding ($L_C$) and thereby inducing a magnetic flux in the core, in order to counteract the magnetic flux induced by the primary conductor ($L_1$);
  periodically energizing the at least one exciter winding ($L_S$) and thereby, to the extent energized, inducing a magnetic flux in at least two flux paths ($R_{1a}$, $R_{1b}$, $R_{2a}$, $R_{2b}$) wound by the at least one exciter winding ($L_S$) and thereby modulating the said flux paths ($R_{1a}$, $R_{1b}$, $R_{2a}$, $R_{2b}$) magnetically;
  sensing, by means of the at least one measuring winding ($L_M$), the change of the magnetic flux between various energization conditions of the exciter winding ($L_S$), in order to tap a demodulation signal for regulation of the magnetic flux induced by the compensating winding ($L_C$);

setting the compensating current ($I_C$) to a value such that the change of magnetic flux sensed by the at least one measuring winding ($L_M$) is minimized;

measuring the compensating current ($I_C$); and calculating the primary current ($I_1$) from the compensating current ($I_C$).

16. The method of claim 15, wherein two exciter windings ($L_S$) of the at least one exciter windings are operated in opposition.

17. The method of claim 15, wherein the ends of the at least one measuring winding ($L_M$) are connected alternately to the input of an integrator (I).

18. The method of claim 17, wherein a demodulator (D) is synchronized with a modulator unit (M).

19. The method of claim 17, wherein the output signal of a demodulator (D) is converted by means of the integrator (I) into the compensating current ($I_C$).

20. The method of claim 17, wherein the output signal of a demodulator is converted into the compensating current ($I_C$) by means of the integrator (I) and the second operational amplifier (K), which receives a feedback signal from the first operational amplifier (G).

21. The method of claim 15, further comprising measurement of inductance of the at least one exciter winding ($L_S$) and generation of a signal that indicates whether or not the respective measured inductance lies within a specified range.

* * * * *